(12) United States Patent
Gulani et al.

(10) Patent No.: US 11,747,421 B2
(45) Date of Patent: Sep. 5, 2023

(54) SYSTEM AND METHOD FOR QUANTIFYING PERFUSION USING A DICTIONARY MATCHING

(71) Applicant: Case Western Reserve University, Cleveland, OH (US)

(72) Inventors: Vikas Gulani, Shaker Heights, OH (US); Satyam Ghodasara, Cleveland, OH (US); Katherine Wright, Macedonia, OH (US); Nicole Seiberlich, Shaker Heights, OH (US); Mark A. Griswold, Shaker Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 174 days.

(21) Appl. No.: 16/416,707

(22) Filed: May 20, 2019

(65) Prior Publication Data
US 2019/0353736 A1    Nov. 21, 2019

Related U.S. Application Data

(60) Provisional application No. 62/673,823, filed on May 18, 2018.

(51) Int. Cl.
*G01R 33/56* (2006.01)
*G01R 33/563* (2006.01)

(52) U.S. Cl.
CPC ..... *G01R 33/5608* (2013.01); *G01R 33/5601* (2013.01); *G01R 33/56366* (2013.01)

(58) Field of Classification Search
CPC ............ G01R 33/5601; G01R 33/5608; G01R 33/56308; G01R 33/5635; G01R 33/56366
See application file for complete search history.

(56) References Cited

U.S. PATENT DOCUMENTS

| | | | |
|---|---|---|---|
| 2010/0080757 A1* | 4/2010 | Haaga | A61B 5/411 424/9.4 |
| 2014/0296702 A1* | 10/2014 | Griswold | G01R 33/4822 600/416 |
| 2016/0025835 A1* | 1/2016 | Gulani | A61B 5/0035 600/420 |
| 2016/0073992 A1* | 3/2016 | Liu | A61B 6/5247 600/425 |

(Continued)

OTHER PUBLICATIONS

Bultman, E. M., et al. "Quantitative hepatic perfusion modeling using DCE-MRI with sequential breathholds." Journal of Magnetic Resonance Imaging 39.4 (2014): 853-865. First Published Nov. 4, 2013.

(Continued)

*Primary Examiner* — Steven L Yeninas
(74) *Attorney, Agent, or Firm* — Quarles & Brady LLP

(57) ABSTRACT

The present application provides a system and method for quantifying perfusion using a dictionary matching approach. In some aspects, the method comprises performing a predetermined pulse sequence using an MRI system to acquire MRI data from the subject after having delivered a dose of a contrast agent to the subject. The method also includes comparing the MRI data to a dictionary to determine perfusion information, and generating, using the perfusion information, a report indicative of perfusion within the subject.

14 Claims, 4 Drawing Sheets

(56) References Cited

U.S. PATENT DOCUMENTS

| | | | | |
|---|---|---|---|---|
| 2017/0035319 A1* | 2/2017 | Zhao | ............... | A61B 5/0263 |
| 2017/0276753 A1* | 9/2017 | Cohen | ............... | G01R 33/482 |
| 2017/0325709 A1* | 11/2017 | Nayak | ............... | A61B 5/0042 |
| 2019/0054194 A1* | 2/2019 | Yu | ............... | G06T 7/168 |
| 2020/0050819 A1* | 2/2020 | Sommer | ............ | G01R 33/5635 |

OTHER PUBLICATIONS

Chen, Y., et al. "Free-breathing liver perfusion imaging using 3D through-time spiral GRAPPA acceleration." Investigative radiology 50.6 (2015): 367.

Ma, D., et al. "Magnetic resonance fingerprinting." Nature 495.7440 (2013): 187-192.

Materne, R., et al. "Non-invasive quantification of liver perfusion with dynamic computed tomography and a dual-input one-compartmental model." Clinical science 99.6 (2000): 517-525.

Panda, A., et al. "Magnetic resonance fingerprinting-an overview." Current opinion in biomedical engineering 3 (2017): 56-66.

* cited by examiner

SYSTEM AND METHOD FOR QUANTIFYING PERFUSION USING A DICTIONARY MATCHING

CROSS-REFERENCE TO RELATED APPLICATIONS

This application is based on, claims priority to, and incorporates herein in its entirety, U.S. Application Ser. No. 62/673,823 filed on May 18, 2018, and entitled "Quantifying Perfusion Properties with DCE-MRI Using a Dictionary Matching Approach."

STATEMENT REGARDING FEDERALLY SPONSORED RESEARCH OR DEVELOPMENT

This invention was made with government support under EB016728 and DK098503 awarded by the National Institutes of Health. The government has certain rights in the invention.

BACKGROUND

The present disclosure relates generally to systems and methods for quantifying perfusion properties using magnetic resonance (MR) signals.

When human tissue or other substance is subjected to a uniform magnetic field (polarizing field B0), the individual magnetic moments of the nuclei in the tissue attempt to align with the polarizing field, and precess about it in random order at their characteristic Larmor frequency. If the tissue, or substance, is subjected to a magnetic field (excitation field B1) that is in the x-y plane and near the Larmor frequency, the net aligned moment, $M_z$, may be rotated, or "tipped", into the x-y plane to produce a net transverse magnetic moment $M_{xy}$. An MR signal is emitted by the excited nuclei or "spins", after the excitation signal B1 is terminated, and the signal may be received and processed to form an image.

When utilizing MR signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using various reconstruction techniques.

Dynamic contrast-enhanced (DCE) magnetic resonance imaging (MRI) is a particular type of MR imaging that analyzes the temporal signal enhancement pattern of a region of interest (ROI) in tissue upon administration of a contrast agent. Specifically, MR signals are acquired for the ROI over time, and are then used to generate a time intensity curve that reflects the tissue's response to the arrival of the contrast. This DCE-MRI data is then combined with pharmacokinetic models to estimate perfusion properties. To do so, a curve fitting algorithm typically is used to find the best fit to solve for the perfusion properties.

However, such conventional curve-fitting approaches have several drawbacks. Specifically, curve fitting has many configurational options and involve certain algorithm assumptions, including selecting initial values, tolerances, cost functions, and so forth. Therefore, results may vary depending on the selection. Additionally, curve fitting is prone to converging on local minima in complex models, and may require significant time to generate perfusion maps for one 3D DCE-MRI liver acquisition, for instance.

Therefore, there is a continued need for improved systems and methods that accurately quantify perfusion in tissue.

SUMMARY

The present disclosure overcomes the drawbacks of previous technologies by providing a dictionary matching approach to quantify perfusion properties of tissue.

In accordance with one aspect of the present disclosure, a method for generating images of a subject using a magnetic resonance imaging (MRI) system is provided. The method includes performing a predetermined pulse sequence using an MRI system to acquire MRI data from the subject after having delivered a dose of a contrast agent to the subject. The method also includes comparing the MRI data to a dictionary to determine perfusion information, and generating, using the perfusion information, a report indicative of perfusion within the subject.

A magnetic resonance imaging (MRI) system is provided. The system includes a magnet system configured to generate a polarizing magnetic field about a portion of the subject positioned in the MRI system, a plurality of gradient coils configured to apply a gradient field to the polarizing magnetic field, and a radio frequency (RF) system configured to apply a RF excitation field to the subject, and acquire therefrom a set of magnetic resonance image (MRI) data. The system also includes at least one processor configured to control the plurality of gradient coils and RF system to perform a predetermined pulse sequence to acquire MRI data from the subject after having delivered a dose of a contrast agent to the subject. The at least one processor is also configured to compare the MRI data to a dictionary to determine perfusion information, and generate, using the perfusion information, a report indicative of perfusion within the subject.

BRIEF DESCRIPTION OF THE DRAWINGS

The present invention will hereafter be described with reference to the accompanying drawings, wherein like reference numerals denote like elements.

DETAILED DESCRIPTION

To overcome aforementioned drawbacks, the present disclosure foregoes curve fitting. Instead, a dictionary matching approach is applied. In contrast to conventional curve fitting methods, the present approach requires minimal configuration and can be performed faster. As will be described, dictionary matching was tested in simulation and validated with in vivo data to estimate liver perfusion properties. However, the present approach may be broadly applicable other tissues as well.

Figure 1:
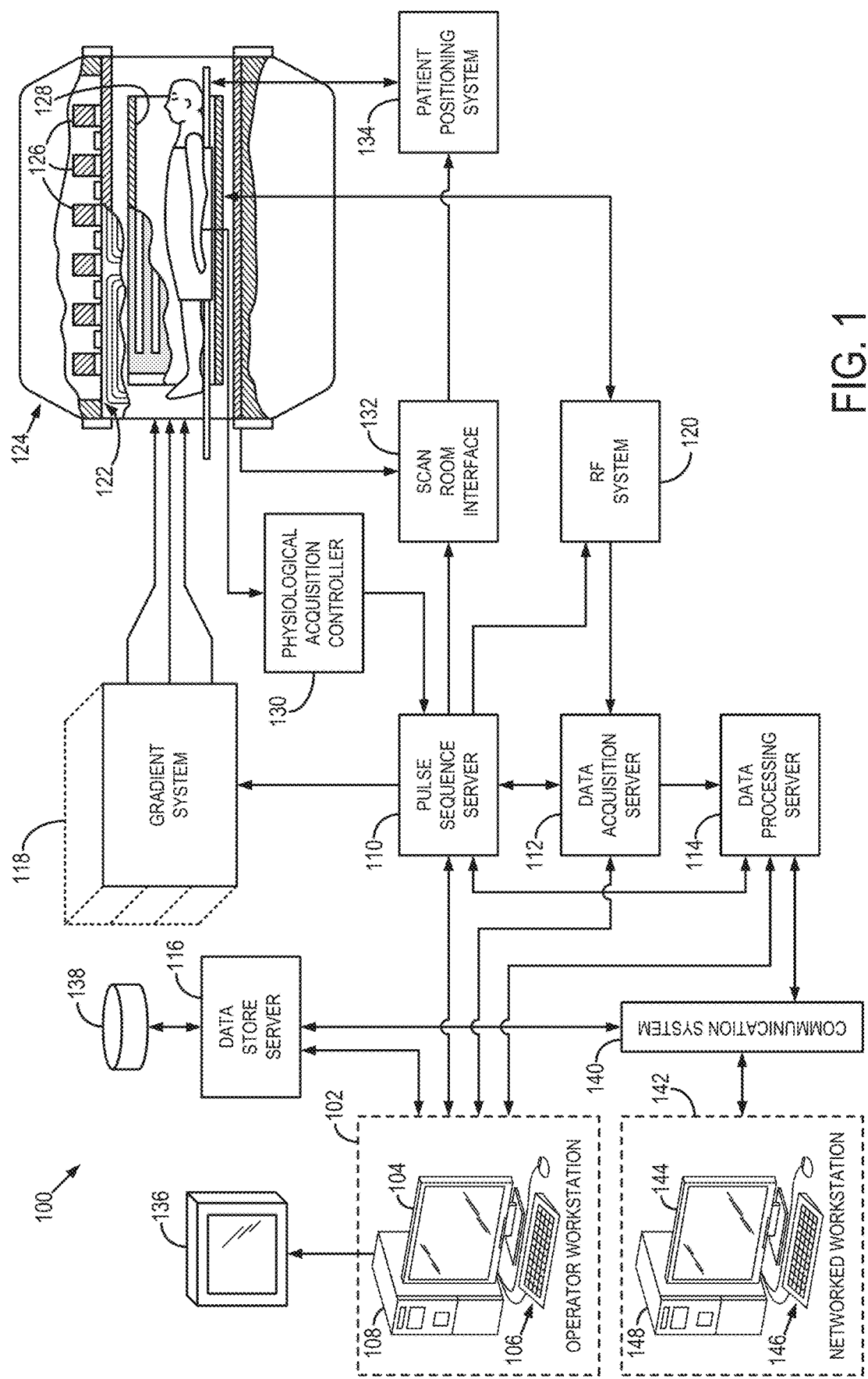
FIG. 1 is a schematic diagram of an example magnetic resonance imaging (MRI) system, in accordance with aspects of the present disclosure.

For example, referring to FIG. 1 a magnetic resonance imaging (MRI) system 100 is configured to perform such a processes. The MRI system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency (RF) system 120. Gradient waveforms to perform the prescribed scan are produced and applied to the gradient system 118, which excites gradient coils in an assembly 122 to produce the magnetic field gradients $G_x$, $G_y$, $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad \text{Eqn. 1;}$$

and the phase of the received magnetic resonance signal may also be determined according to the following relationship:

$$\varphi = \tan^{-1}\left(\frac{Q}{I}\right) \quad \text{Eqn. 2.}$$

The pulse sequence server 110 also optionally receives patient data from a physiological acquisition controller 130. By way of example, the physiological acquisition controller 130 may receive signals from a number of different sensors connected to the patient, such as electrocardiograph (ECG) signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography (MRA) scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; and so on.

Images reconstructed by the data processing server 114 are conveyed back to the operator workstation 102. Images may be output to operator display 112 or a display 136 that is located near the magnet assembly 124 for use by attending clinician. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

In some aspects, the data processing server 114 may be configured to generate perfusion information, in accordance with aspects of the present disclosure. In particular, the data processing server 114 may be configured to receive magnetic resonance data (e.g. DCE-MRI data, and others) and compare it a dictionary to determine a perfusion within the subject. By way of example, perfusion information may include arterial fraction (AF), distribution volume (DV), mean transit time (MTT), cerebral blood flow (CBF), time-to-peak (TTP), cerebral blood volume (CBV), and other perfusion parameters, as well as tissues, voxels or regions of interest associated with such parameters.

The data processing server 114 may also be configured to reconstruct an image of the subject or generate a report indicating the perfusion within the subject. To this end, the data processing server 114 may include various computing capabilities, including various general-purpose processors, as well as various dedicated processing modules or logic (not shown in FIG. 1). For example, the data processing server 114 may include a dictionary matching module or logic that is configured to compare acquired MRI data to a dictionary in order to determine perfusion information. The data processing server 114 may also include a dictionary generating module or logic that is configured to generate a dictionary using acquired MRI data. Other modules or logic for carrying out specific functions, as described herein, may also be possible. To this end, the data processing server 114 may be configured to access and retrieve data stored in a memory or other data storage location.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol (TCP), the internet protocol (IP), or other known or suitable protocols.

Figure 2:
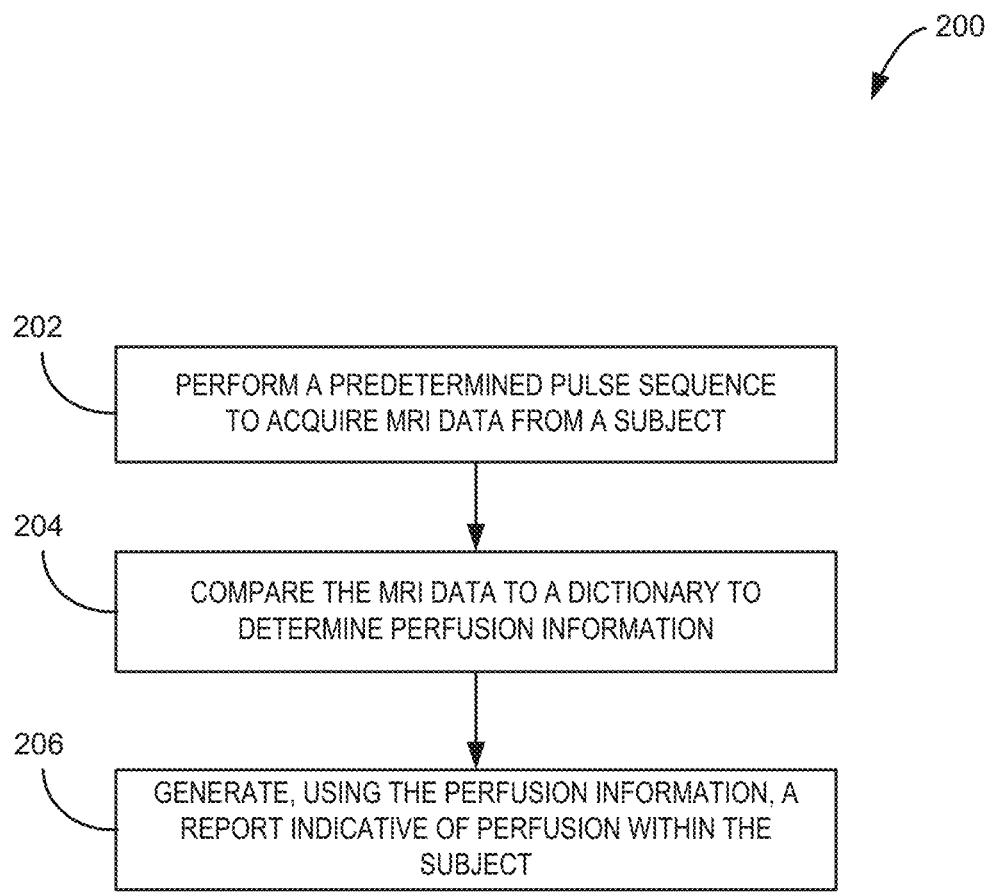
FIG. 2 is a flowchart setting forth steps of a process, in accordance with aspects of the present disclosure.

Turning now to FIG. 2, a flowchart setting forth steps of a process 200, in accordance with aspects of the present disclosure, is illustrated. In some implementations, steps of the process 200 may be carried out using the systems described with reference to FIG. 1, although other systems and devices may also be used. Also, steps of the process 200 may be implemented as a program, firmware, software, or instructions that may be stored in non-transitory computer readable media and executed by a general-purpose, programmable computer, processor or other suitable computing device. In some implementations, steps of the process 200 may also be hardwired in various application-specific processors, modules or logic, as described.

As shown, the process 200 may begin at process block 202 with performing a pulse sequence to acquire MRI data from a subject. By way of example, the MRI data may include DCE-MRI data acquired prior to, during, and/or after administration of a contrast agent. This step may include controlling an MRI system, as described, to perform a predetermined pulse sequence to carry out a traditional DCE or perfusion imaging study. Alternatively, as will be further described, other pulse sequences may be utilized, such as to perform a magnetic resonance fingerprinting (MRF) study. That is, as will be described, a traditional DCE-MRI study may be performed or a contrast enhance dMRF study that to generates a "fingerprint" or signal evolution for one or more regions of interest (ROIs) may be performed.

Then, at process block 204, acquired MRI data may be compared to a dictionary to determine perfusion information. This step may include executing a pattern matching algorithm that correlates patterns of signal evolutions with corresponding entries in a dictionary of possible signal evolutions generated for the pre-determined pulse sequence. While this pattern matching algorithm may take different forms, some example realizations include the use of an inner product, a template match, a matrix inversion, a correlation, a Bayesian estimation, basis pursuit, simulated annealing, or through the use of a neural network or deep learning network. The dictionary matching may be performed on a voxel-by-voxel basis to determine various perfusion parameters in the ROI(s). The dictionary may also be compressed prior to matching. This can include singular value decomposition (SVD), randomized SVD, tree-based searches, such as fast group matching, independent component analysis (ICA), feature extraction, or other neural network based compression algorithms.

As one non-limiting example, example apparatus and methods may denote the MRF dictionary by DECnxt, where n is the number of parameter combinations and t is the number of time points. Example apparatus and methods may denote by $d_j$, j=1 . . . , n the jth row of D. The dictionary match for an observed noisy signal evolution may be determined by a process similar to query or template matching. For example, the observed signal evolution, denoted x, may be compared to dictionary entries by using the complex inner product. The complex inner product may determine which entry in the dictionary matches the signal evolution with highest probability. A dictionary entry di may be chosen that satisfies $$d_l = \arg\max_{1 \le j \le n} |d_j x|,$$

where x denotes the vector x and | . . . | represents the modulus. Once the match has been discovered, example apparatus and methods may assign to the material that generated the signal the MR parameters (e.g., T1, T2, off-resonance) associated with the matching entry in the dictionary. In one embodiment, MR parameters associated with dictionary entries may be stored in the dictionary. In another embodiment, MR parameters associated with dictionary entries may be stored outside the dictionary but be retrievable using a dictionary entry or dictionary entry identifier.

In some aspects, the dictionary may be generated at, or prior to, process block 204, using mathematical algorithms that can predict spin behavior and signal evolution. For instance, the dictionary may be estimated by combining a wide range of physical and hemodynamic properties with the pseudo-random or variable pulse sequence and a pharmacokinetic model, such as a single-input single compartment (SISC) model, a dual-input single-compartment (DISC) model or other model that relates the concentration of the contrast agent to the resulting MRI or MRF signal evolutions. Specifically, the model can accept the MRF pulse sequence and a set of tissue properties that include conventional MRI properties, such as T1 and T2, as well as tissue perfusion properties. Each dictionary entry then corresponds to one combination of MRI, tissue, and perfusion properties. These entries may also include system properties, such as the B1 field or B0 field or off-resonance terms.

A report indicative of perfusion within the subject may then be generated at process block 206 using the perfusion information. In some aspects, this step may include reconstructing one or more images or maps of the subject depicting variation of perfusion parameters across tissues in the ROI(s).

In accordance with one non-limiting example, the present dictionary matching approach is applied to liver DCE-MRI data used with a DISC model having the form of:

$$\frac{dC_L(t)}{dt} = k_{1a}C_a(t-\tau_a) + k_{1p}C_p(t-\tau_p) - k_2 C_L(t); \quad \text{Eqn. 3}$$

where $dC_L(t)/dt$ is the rate of change of the contrast, $k_{1a}$, $k_{1p}$, and $k_2$ are rate constants reformulated as the arterial fraction (AF), distribution volume (DV), and mean transit time (MTT) as described in Materne R et al., Clin Sci 2000 2. Chen Y et al., Invest Radiol 2015 3. Bultman E M et al., JMRI 2013 4. Ma D et al., Nature 2013, which is incorporated herein by reference in its entirety. Furthermore, t is time, $C_a$ is concentration of contrast agent in the arteries as a function of time, $C_p$ is the concentration of contrast agent in the portal vein, $\tau_a$ is the time of arrival of the contrast agent bolus in the arteries, and $\tau_p$ is the time of arrival of the contrast agent bolus in the portal vein.

In one non-limiting study, the performance and accuracy of curve fitting was compared to dictionary matching in accordance with the present disclosure. The function lsqcurvefit in MATLAB was used to fit AF, DV, MTT, τa, and τp with a step tolerance of 1×10-2, a function tolerance of 1×10-10, and a minimum gradient change of 0.001. Fitting bounds were set to 0-1, 0-1, 1-100 s, 0-20 s, and 0-20 s with initial parameter estimates of 0.2, 0.2, 10 s, 10 s, and 10 s for AF, DV, MTT, τa, and τp, respectively.

For matching, subject-specific dictionaries were created with ranges of 0-1, 1-100 s, 0-25 s, and 0-25 s with step sizes of 0.01, 1 s, 1 s, and 1 s for AF, MTT, τa, and τp, respectively. Each permutation of AF, MTT, τa, and τp was used to calculate a liver tissue contrast concentration curve from the DISC model. 3D DCE-MRI data were converted to contrast concentrations using the spoiled gradient echo signal equation. The acquired concentration curves were matched to the dictionary by identifying the maximum correlation coefficient. From this dictionary index, the perfusion properties used to generate the entry were obtained. DV is subsequently calculated as a scaling term.

Both methods were compared using Monte Carlo simulations. An idealized contrast concentration curve was created from the DISC model using idealized input functions and AF of 0.25, DV of 0.30, MTT of 9 s, τa of 8 s, and τp of 4 s.

From this curve, 100 additional curves were generated by adding noise at eight SNR levels from 1-100. Curve fitting was performed with and without the MATLAB function MultiStart, which was configured to randomize 1000 initial parameter estimates to avoid converging on a local minimum. Of the 1000 fits resultant from each initial parameter estimate, the fit associated with the smallest error is considered best. The major drawback to MultiStart is that the time required to converge on a solution scales linearly with the number of randomized initial parameter estimates. The root mean square error (RMSE) among each method's estimated curve and the idealized curve was calculated at each SNR.

Curve fitting without MultiStart and dictionary matching were further applied to 3D DCE-MRI acquisitions from 5 subjects (2 volunteers, 2 patients with metastatic adenocarcinoma, and 1 patient with hepatocellular carcinoma) using a highly accelerated 3D spiral acquisition and a through-time spiral GRAPPA reconstruction. Curve fitting with MultiStart was also applied to one slice of one of the metastatic adenocarcinoma patient's liver. Applying curve fitting with MultiStart to a whole 3D liver acquisition was not performed due to impractical computational time requirements.

Figure 3:
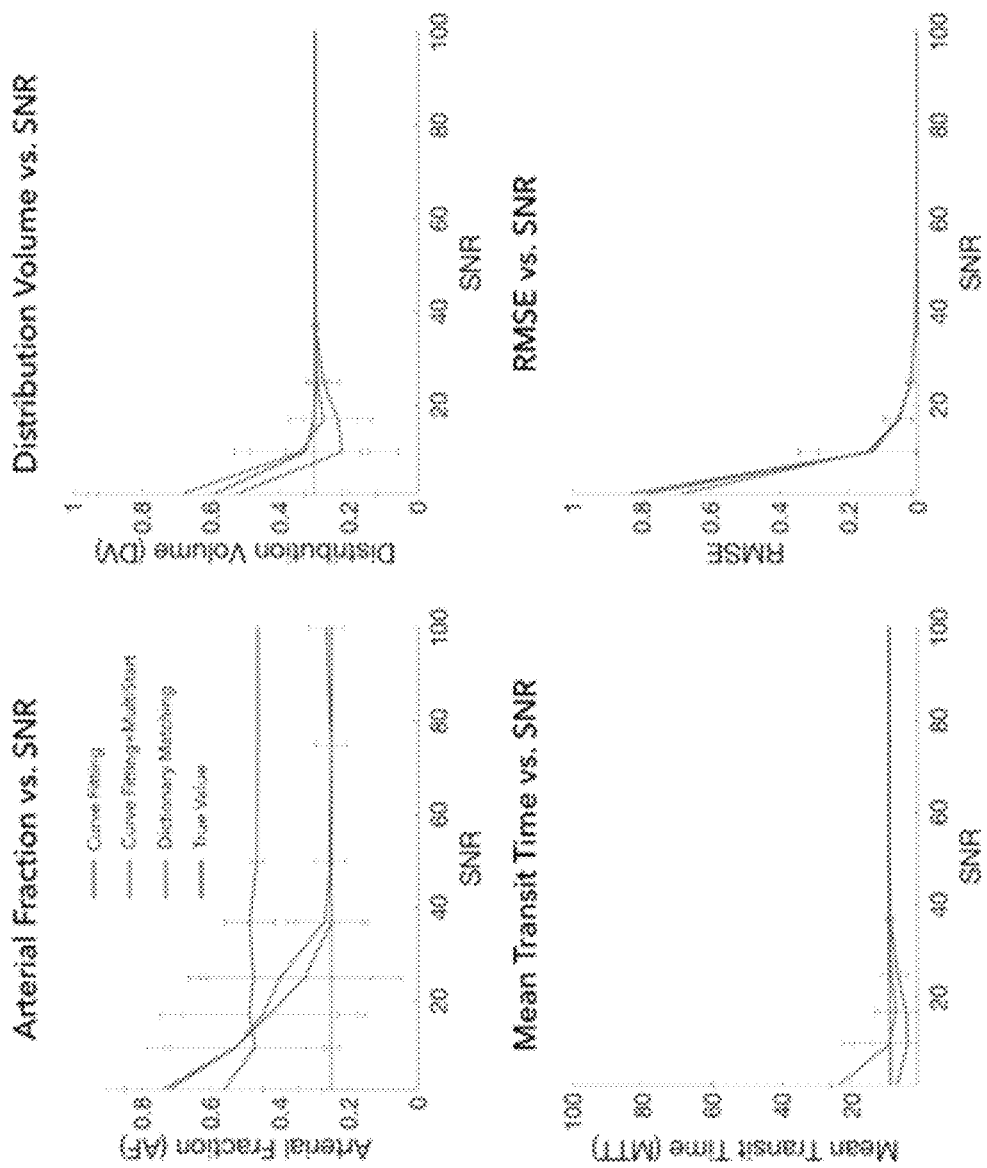
FIG. 3 show graphs showing the accuracy of conventional methods for quantifying perfusion in comparison with the present dictionary matching approach.
Figure 4:
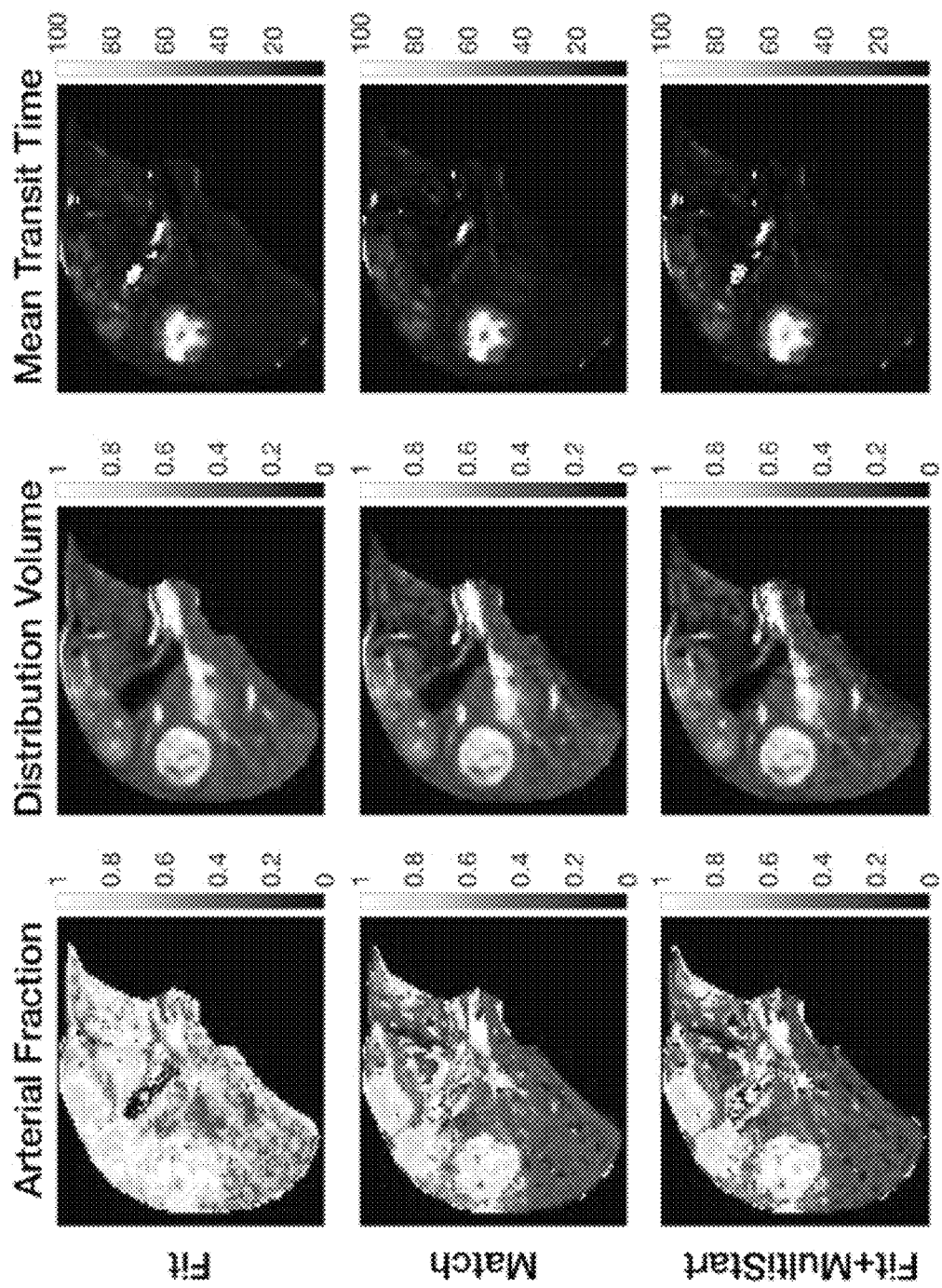
FIG. 4 are images showing perfusion results in the liver obtained using conventional methods and the present dictionary matching approach.

FIG. 3 shows the AF, DV, and MTT properties quantified by curve fitting with and without MultiStart and dictionary matching methods against each SNR from the Monte Carlo simulations as well as the RMSE between the estimated curves and the ideal curve against each SNR. FIG. 4 shows single-slice perfusion maps using curve fitting with and without MultiStart and dictionary matching methods for a patient with metastatic adenocarcinoma.

While dictionary matching perfusion maps differ from those obtained using conventional curve fitting, the Monte Carlo simulations indicate dictionary matching provides a more accurate estimate of the measured data. A comparison of curve fitting with and without MultiStart in simulation strongly suggests curve fitting without MultiStart may often be corrupted by local minimum solutions. The in vivo data suggest the same, with the fitted properties moving much closer to dictionary matching with the use of MultiStart to decrease the dependence on initial guess. These initial results suggest that dictionary matching is effective when used to both decrease computation time and improve measurement fidelity in DCE experiments.

The present invention has been described in terms of some preferred embodiments, and it should be appreciated that equivalents, alternatives, variations, and modifications, aside from those expressly stated, are possible and within the scope of the invention.

The invention claimed is:

1. A method for generating images of a subject using a magnetic resonance imaging (MRI) system, the method including steps comprising:
    performing a predetermined pulse sequence using an MRI system to acquire dynamic contrast-enhanced (DCE) MRI data from a liver of the subject after having delivered a dose of a contrast agent to the subject;
    comparing the acquired DCE MRI data to a dictionary to determine perfusion information including at least one perfusion parameter including a distribution volume (DV), wherein the dictionary includes a plurality of entries and each entry includes one or more associated perfusion parameters and comparing the acquired DCE MRI data to the dictionary comprises identifying an entry in the dictionary based on the comparison and assigning the one or more associated perfusion parameters of the identified dictionary entry to the acquired DCE MRI data; and generating, using the perfusion information including at least one perfusion parameter, a report indicative of perfusion within the liver of the subject;

wherein the dictionary is generated using a dual-input single compartment (DISC) pharmacokinetic model.

2. The method of claim 1, wherein the at least one perfusion parameter further comprises at least one of an arterial fraction (AF), and a mean transit time (MTT).

3. The method of claim 1, wherein the method further comprises comparing the DCE MRI data by executing a pattern matching algorithm that correlates patterns of signal evolutions associated with the DCE MRI data and corresponding entries in the dictionary.

4. The method of claim 3, wherein the pattern matching algorithm includes at least one of an inner product, a template match, a matrix inversion, a correlation, a Bayesian estimation, basis pursuit, or simulated annealing.

5. The method of claim 3, wherein the pattern matching is performed using at least one of a neural network or deep learning network.

6. The method of claim 3, wherein the dictionary matching is performed on a voxel-by-voxel basis to determine perfusion parameters.

7. The method of claim 3, wherein the method further comprises generating the dictionary by combining physical and hemodynamic properties with the predetermined pulse sequence and the pharmacokinetic model.

8. The method of claim 1, wherein the method further comprises reconstructing at least one image depicting perfusion in the liver of the subject.

9. The method of claim 1, wherein the dictionary is a compressed dictionary.

10. A magnetic resonance imaging (MRI) system comprising:

a magnet system configured to generate a polarizing magnetic field about a portion of the subject positioned in the MRI system;

a plurality of gradient coils configured to apply a gradient field to the polarizing magnetic field;

a radio frequency (RF) system configured to apply a RF excitation field to the subject, and acquire therefrom a set of magnetic resonance image (MRI) data;

at least one processor configured to:

control the plurality of gradient coils and RF system to perform a predetermined pulse sequence to acquire dynamic contrast-enhanced (DCE) MRI data from a liver of the subject after having delivered a dose of a contrast agent to the subject;

compare the acquired DCE MRI data to a dictionary to determine perfusion information including at least one perfusion parameter including a distribution volume (DV), wherein the dictionary includes a plurality of entries and each entry includes one or more associated perfusion parameters and comparing the acquired DCE Mill data to the dictionary comprises identifying an entry in the dictionary based on the comparison and assigning the one or more associated perfusion parameters of the identified dictionary entry to the acquired DCE MM data; and generate, using the perfusion information including at least one perfusion parameter, a report indicative of perfusion within the liver of the subject;

wherein the dictionary is generated using a dual-input single compartment (DISC) pharmacokinetic model.

11. The system of claim 10, wherein the at least one perfusion parameter further comprises at least one of an arterial fraction (AF), and a mean transit time (MTT).

12. The system of claim 10, wherein the at least one processor is further configured to compare the DCE MRI data by executing a pattern matching algorithm that correlates patterns of signal evolutions associated with the DCE MRI data and corresponding entries in the dictionary.

13. The system of claim 10, wherein the at least one processor is further configured to generate the dictionary by combining physical and hemodynamic properties with the predetermined pulse sequence and the pharmacokinetic model.

14. The system of claim 10, wherein the at least one processor is further configured to reconstruct at least one an image depicting perfusion in the liver of the subject.

* * * * *

UNITED STATES PATENT AND TRADEMARK OFFICE
CERTIFICATE OF CORRECTION

PATENT NO. : 11,747,421 B2
APPLICATION NO. : 16/416707
DATED : September 5, 2023
INVENTOR(S) : Vikas Gulani et al.

It is certified that error appears in the above-identified patent and that said Letters Patent is hereby corrected as shown below:

In the Claims

Claim 10, Column 10, Line 13, "the acquired DCE Mill data to the dictionary" should be --the acquired DCE MRI data to the dictionary--.

Claim 10, Column 10, Line 17, "dictionary entry to the acquired DCE MM data;" should be --dictionary entry to the acquired DCE MRI data;--.

Signed and Sealed this
Sixth Day of February, 2024

Katherine Kelly Vidal
*Director of the United States Patent and Trademark Office*